US012238890B2

(12) United States Patent
Huang et al.

(10) Patent No.: US 12,238,890 B2
(45) Date of Patent: Feb. 25, 2025

(54) EXPANSION FRAME AND SERVER INCLUDING THE SAME

(71) Applicants: INVENTEC (PUDONG) TECHNOLOGY CORPORATION, Shanghai (CN); INVENTEC CORPORATION, Taipei (TW)

(72) Inventors: Wen-Long Huang, Shanghai (CN); Xishan Shen, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 218 days.

(21) Appl. No.: 18/130,835

(22) Filed: Apr. 4, 2023

(65) Prior Publication Data
US 2024/0314968 A1 Sep. 19, 2024

(30) Foreign Application Priority Data
Mar. 15, 2023 (CN) .......................... 202310246560.4

(51) Int. Cl.
*H05K 7/18* (2006.01)
*H05K 5/02* (2006.01)
*H05K 5/03* (2006.01)

(52) U.S. Cl.
CPC ............ *H05K 7/18* (2013.01); *H05K 5/0247* (2013.01); *H05K 5/0286* (2013.01); *H05K 5/03* (2013.01)

(58) Field of Classification Search
None
See application file for complete search history.

(56) References Cited

U.S. PATENT DOCUMENTS

| | | | |
|---|---|---|---|
| 5,757,998 A * | 5/1998 | Thatcher | G02B 6/4261 385/75 |
| 6,344,911 B1 * | 2/2002 | Dailey, Jr. | G02B 6/4452 398/82 |
| 9,252,538 B2 * | 2/2016 | Recce | H01R 13/7175 |
| 10,651,607 B1 * | 5/2020 | Gawlowski | H01R 13/659 |
| 11,637,404 B2 * | 4/2023 | Mongold | H01R 12/594 439/607.06 |
| 11,769,969 B2 * | 9/2023 | Shah | H01R 12/72 439/83 |

(Continued)

*Primary Examiner* — Xanthia C Relford
*Assistant Examiner* — Xanthia C Cunningham
(74) *Attorney, Agent, or Firm* — Maschoff Brennan

(57) ABSTRACT

An expansion frame includes a main body, a cable gathering component fixed to the main body and having a cable management space, two mount cages, a cable organizer including a mount part and a cable organization part connected to each other, four circuit boards, and four connection cables. The mount cages are located on a side of the cable gathering component. The mount part is located between the mount cages. The cable organization part extends from the mount part towards the cable gathering component and has a cable gathering hole connected to the cable management space. Two of the circuit boards are disposed on one of the mount cages, and other two of the circuit boards are disposed on the other of the mount cages. The connection cables are connected to the circuit boards, disposed through the cable gathering hole and extend into the cable management space.

10 Claims, 8 Drawing Sheets

(56) References Cited

U.S. PATENT DOCUMENTS

2005/0255726 A1* 11/2005 Long .................... G02B 6/0001
439/80
2016/0218455 A1* 7/2016 Sayre ................. H01R 13/6594
2017/0285282 A1* 10/2017 Regnier ............... G02B 6/3879

* cited by examiner

EXPANSION FRAME AND SERVER INCLUDING THE SAME

CROSS-REFERENCE TO RELATED APPLICATIONS

This non-provisional application claims priority under 35 U.S.C. § 119(a) on Patent Application No(s). 202310246560.4 filed in China on Mar. 15, 2023, the entire contents of which are hereby incorporated by reference.

TECHNICAL FIELD

This invention relates to an expansion frame and a server including the same, more particularly to an expansion frame and a server including the same supporting four expansion cards and having a cable management space.

BACKGROUND

With the arrival of the internet era, various technology and equipment developments related to internet servers have flourished. With the maturity of communication technology, cross-border e-commerce has replaced traditional regional business models as a trend. As a result, conventional personal computers are no longer sufficient to meet the requirements of enterprises in the marketplace. Therefore, computer manufacturers have developed various servers to meet different requirements of their customers. In order to effectively and stably support the use of a large number of users, servers are designed to support the maximum number of functional modules in a limited space. In this situation, the component configuration within servers is extremely compact.

However, when electronic components, such as graphics cards and hard drives, in servers are densely configured, they are prone to problems such as insufficient space for cable management and poor heat dissipation. Since the densely configured graphics cards and hard drives compress the space for cable management and require higher demands for heat dissipation and ventilation, how to balance the requirements for heat dissipation and cable management convenience in limited space is the goal pursued by researchers.

SUMMARY

The invention is to provide an expansion frame and a server including the same capable of balancing the requirements for heat dissipation and cable management convenience in limited space.

One embodiment of the invention provides an expansion frame, and the expansion frame includes a main body, a cable gathering component, two mount cages, a cable organizer, four circuit boards and four connection cables. The main body has a storage space. The cable gathering component is fixed to the main body, and the cable gathering component has a cable management space. The two mount cages are disposed in the storage space and located on a side of the cable gathering component, and the two mount cages are assembled with each other. The cable organizer includes a mount part and a cable organization part connected to each other. The mount part is disposed between the two mount cages. The cable organization part extends in a direction from the mount part towards the cable gathering component, and the cable organization part has a cable gathering hole connected to the cable management space of the cable gathering component. The four circuit boards each has an expansion slot configured for an expansion card to be inserted into. Two of the four circuit boards are disposed on one of the two mount cages, and the other two of the four circuit boards are disposed on the other of the two mount cages. The four connection cables are connected to the four circuit boards, respectively, and the four connection cables are disposed through the cable gathering hole and extend into the cable management space of the cable gathering component.

One embodiment of the invention provides a server, and the server includes a server casing, an expansion frame and at least one expansion card. The expansion frame is disposed in an interior space of the server casing, and the expansion frame includes a main body, a cable gathering component, two mount cages, a cable organizer, four circuit boards and four connection cables. The main body has a storage space. The cable gathering component is fixed to the main body, and the cable gathering component has a cable management space. The two mount cages are disposed in the storage space and located on a side of the cable gathering component, and the two mount cages are assembled with each other. The cable organizer includes a mount part and a cable organization part connected to each other. The mount part is disposed between the two mount cages. The cable organization part extends in a direction from the mount part towards the cable gathering component, and the cable organization part has a cable gathering hole connected to the cable management space of the cable gathering component. The four circuit boards each has an expansion slot, two of the four circuit boards are disposed on one of the two mount cages, and the other two of the four circuit boards are disposed on the other of the two mount cages. The four connection cables are connected to the four circuit boards, respectively, and the four connection cables are disposed through the cable gathering hole and extend into the cable management space of the cable gathering component. The at least one expansion card is inserted into the expansion slot of one of the four circuit boards.

In view of the above description, since the expansion frame and the server can meet the requirement of supporting four expansion cards, there are many connection cables in the expansion frame. By the cable gathering component and the cable organizer of the expansion frame, the cable wiring in the expansion frame can be simplified, and the connection cables can be properly organized in a limited space, thereby providing a sufficient space for heat dissipation and ventilation and balancing the requirements for heat dissipation and easy cable management.

BRIEF DESCRIPTION OF THE DRAWINGS

The invention will become more fully understood from the detailed description given hereinbelow and the accompanying drawings which are given by way of illustration only and thus are not limitative of the invention and wherein.

DETAILED DESCRIPTION

Aspects and advantages of the invention will become apparent from the following detailed descriptions with the accompanying drawings. For purposes of explanation, one or more specific embodiments are given to provide a thorough understanding of the invention, and which are described in sufficient detail to enable one skilled in the art to practice the described embodiments. It should be understood that the following descriptions are not intended to limit the embodiments to one specific embodiment. On the contrary, it is intended to cover alternatives, modifications, and equivalents as can be included within the spirit and scope of the described embodiments as defined by the appended claims.

Figure 1:
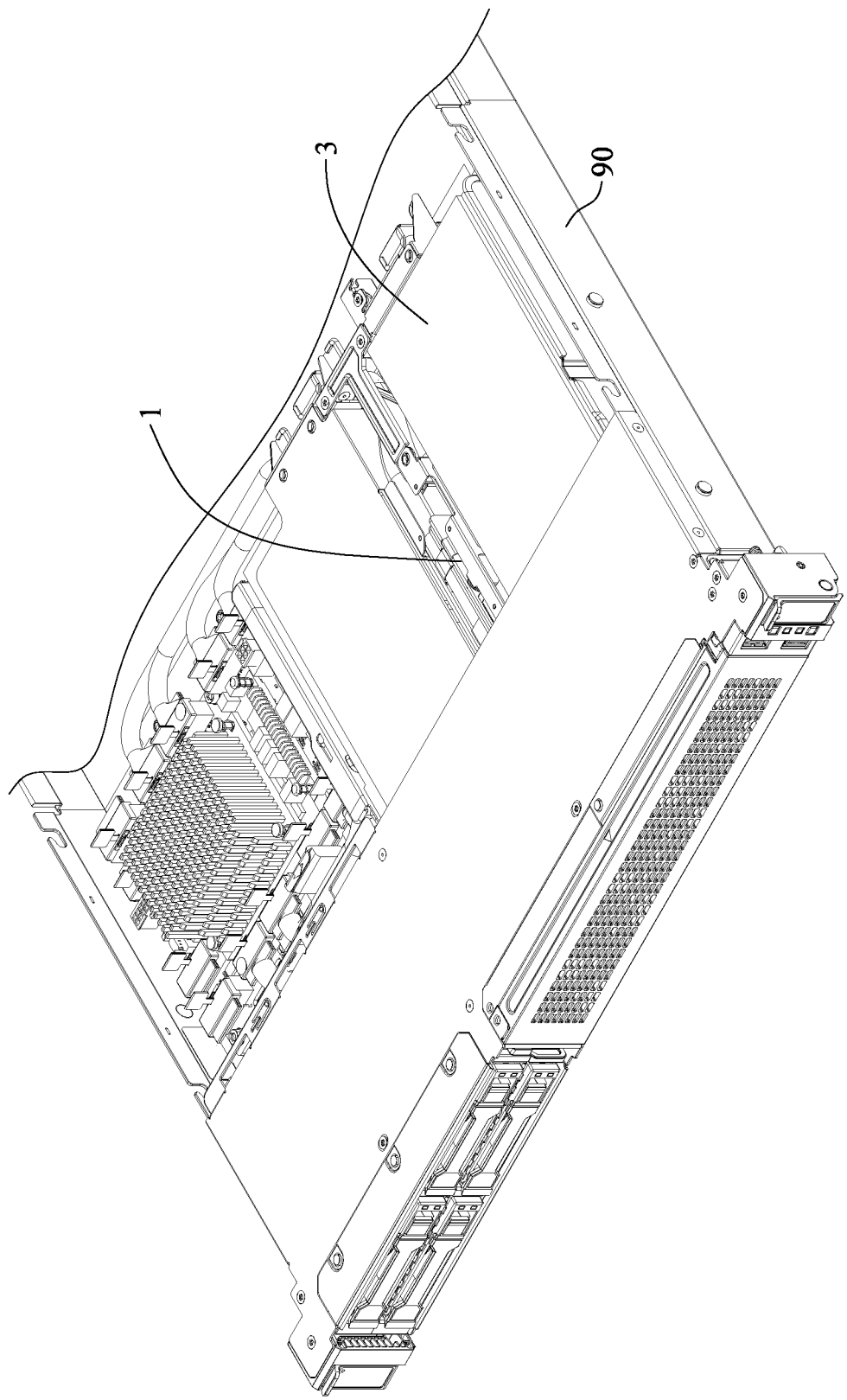
FIG. 1 is a perspective view of a server in accordance with one embodiment of the invention.
Figure 2:
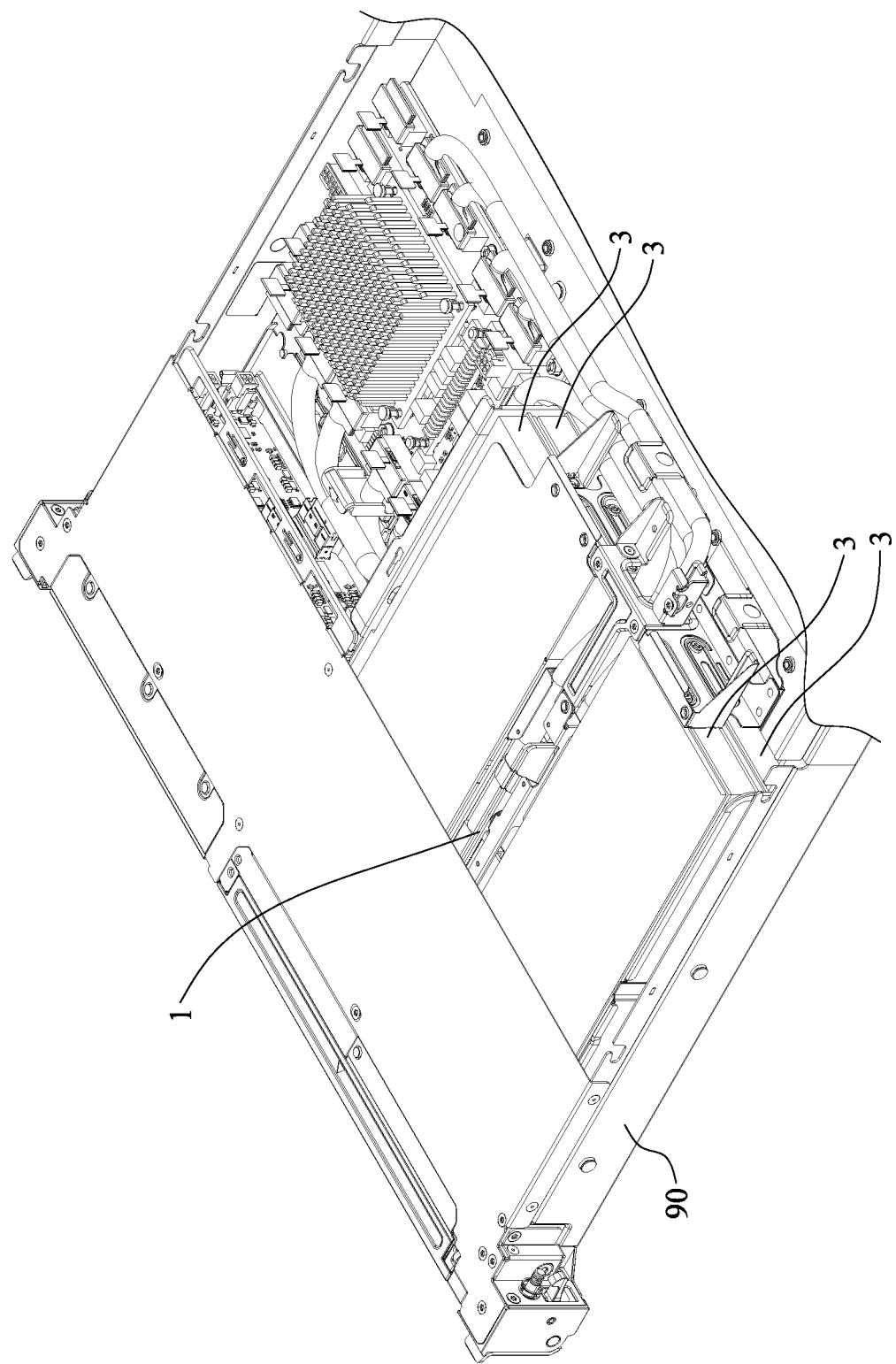
FIG. 2 is another perspective view of the server in FIG. 1.
Figure 3:
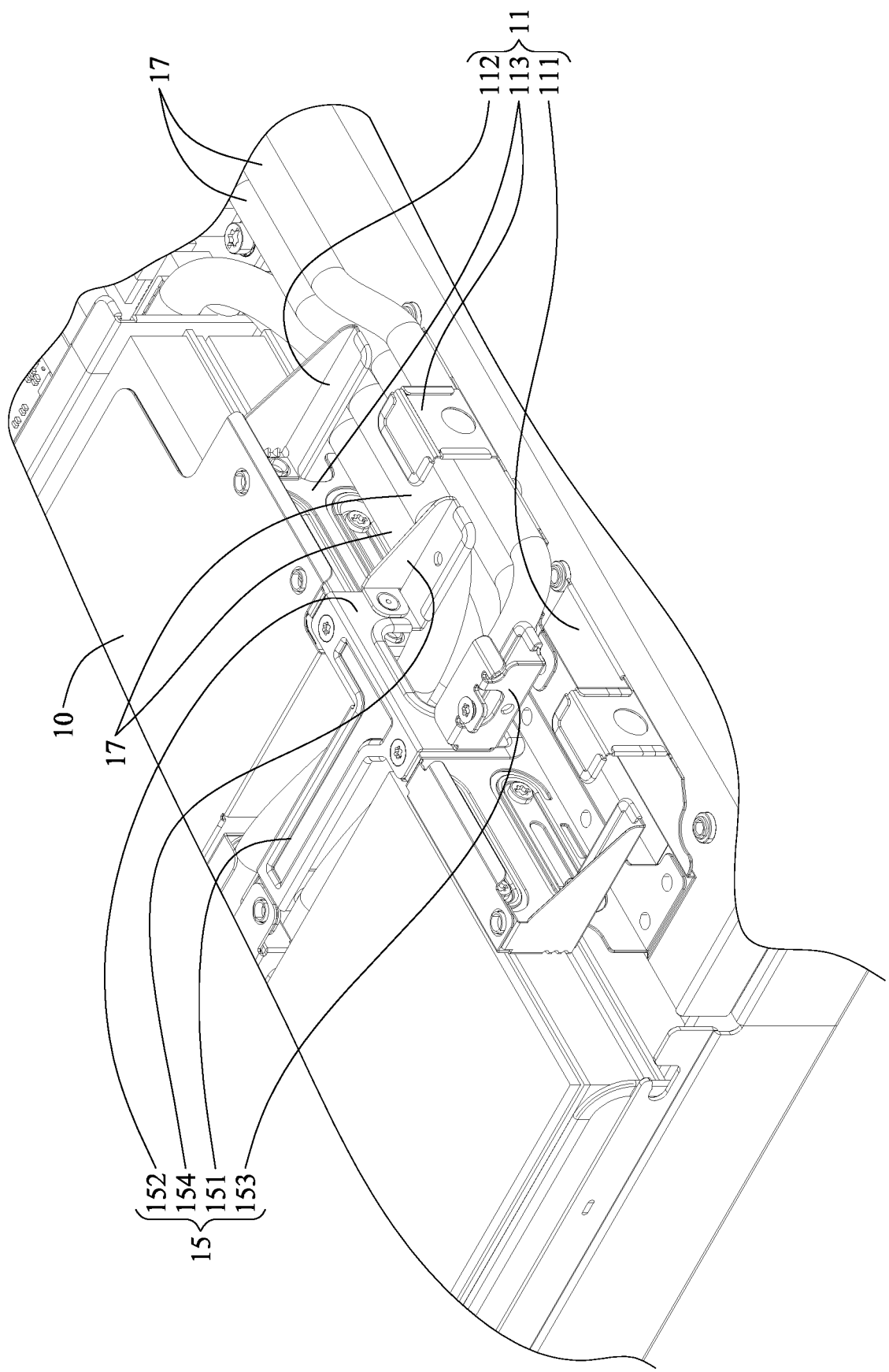
FIG. 3 is a partial and enlarged view of the server in FIG. 2.
Figure 4:
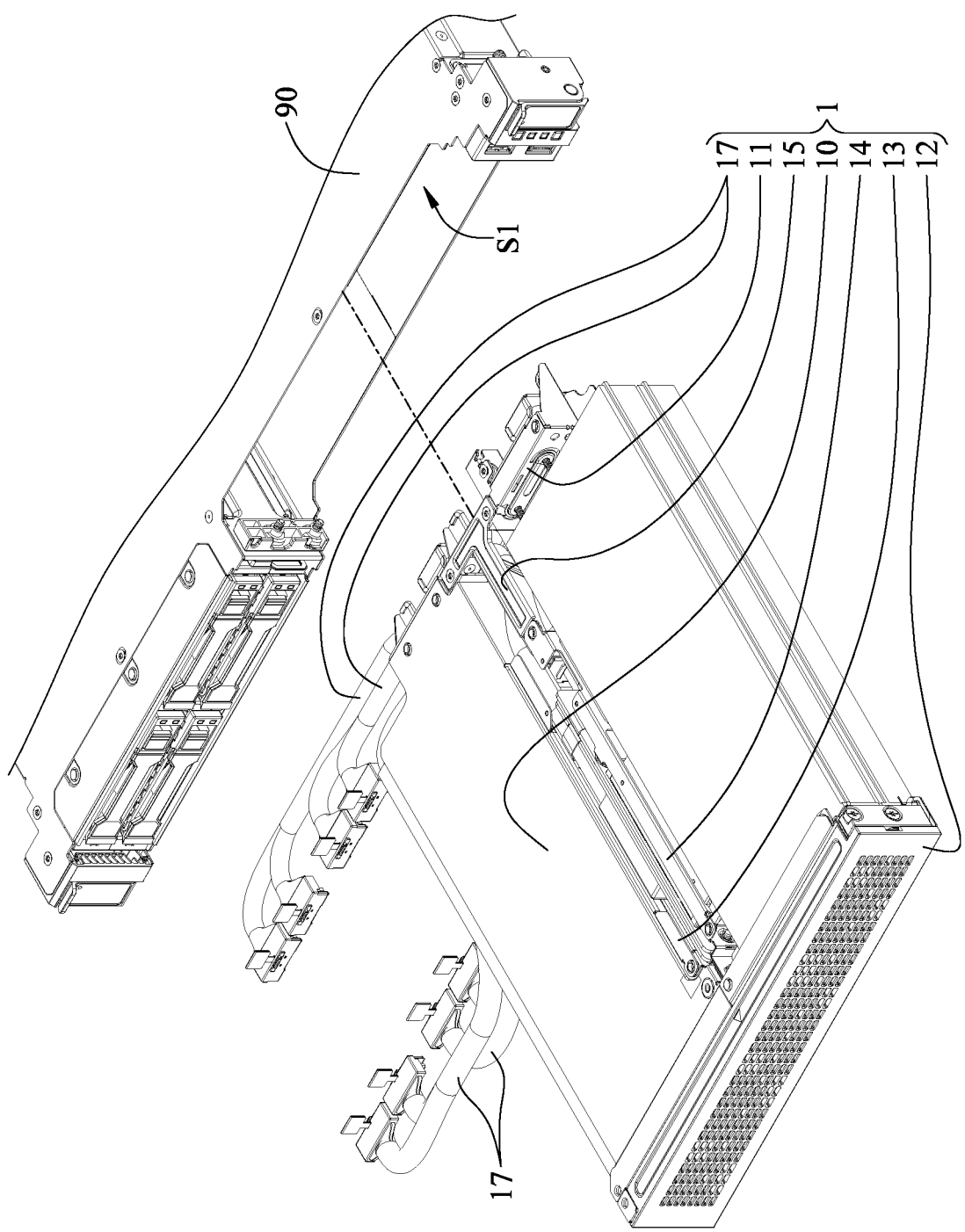
FIG. 4 is an exploded view of the server in FIG. 1.

Please refer to FIG. 1 to FIG. 4. FIG. 1 is a perspective view of a server in accordance with one embodiment of the invention, FIG. 2 is another perspective view of the server in FIG. 1, FIG. 3 is a partial and enlarged view of the server in FIG. 2, and FIG. 4 is an exploded view of the server in FIG. 1.

In this embodiment, a server 9 is provided. The server 9 includes a server casing 90, an expansion frame 1 and four expansion cards 3. In this embodiment, the server 9 is a 1U server as exemplary, which can support up to four expansion cards 3, but the invention is not limited thereto. In other embodiments, the server may be, for example, a 2U server or a 4U server, and the server may support different numbers of expansion cards. In this embodiment, the expansion cards 3 are GPUs as exemplary, but the invention is not limited thereto. In other embodiments, the expansion cards 3 may be, for example, sound cards, network cards or memory cards having different functions. In addition, the expansion cards 3 may be, for example, PCI interface cards, but the invention is not limited thereto.

The expansion frame 1 is disposed in an interior space S1 of the server casing 90. The expansion frame 1 includes a main body 10, a cable gathering component 11, a cover 12, two mount cages 13 and 14, a cable organizer 15, four circuit boards 16 and four connection cables 17.

The cable gathering component 11 is fixed to the main body 10, and the cover 12 is disposed on a side of the main body 10 opposite to the cable gathering component 11. In addition, the cable gathering component 11 has a cable management space 110. In detail, the cable gathering component 11 includes a bottom plate 111, a top plate 112 and two lateral plates 113. The two lateral plates 113 are opposite to each other and connected to the bottom plate 111, and the lateral plates 113 are located between the bottom plate 111 and the top plate 112. The bottom plate 111, the top plate 112 and the lateral plates 113 together surround and form the cable management space 110. Furthermore, one of the lateral plates 113 of the cable gathering component 11 is connected to the top plate 112 and fixed to the main body 10.

The main body 10 has a storage space S2. The mount cages 13 and 14 are disposed in the storage space S2 of the main body 10 and located on a side of the cable gathering component 11, and the two mount cages 13 and 14 are assembled with each other.

Figure 5:
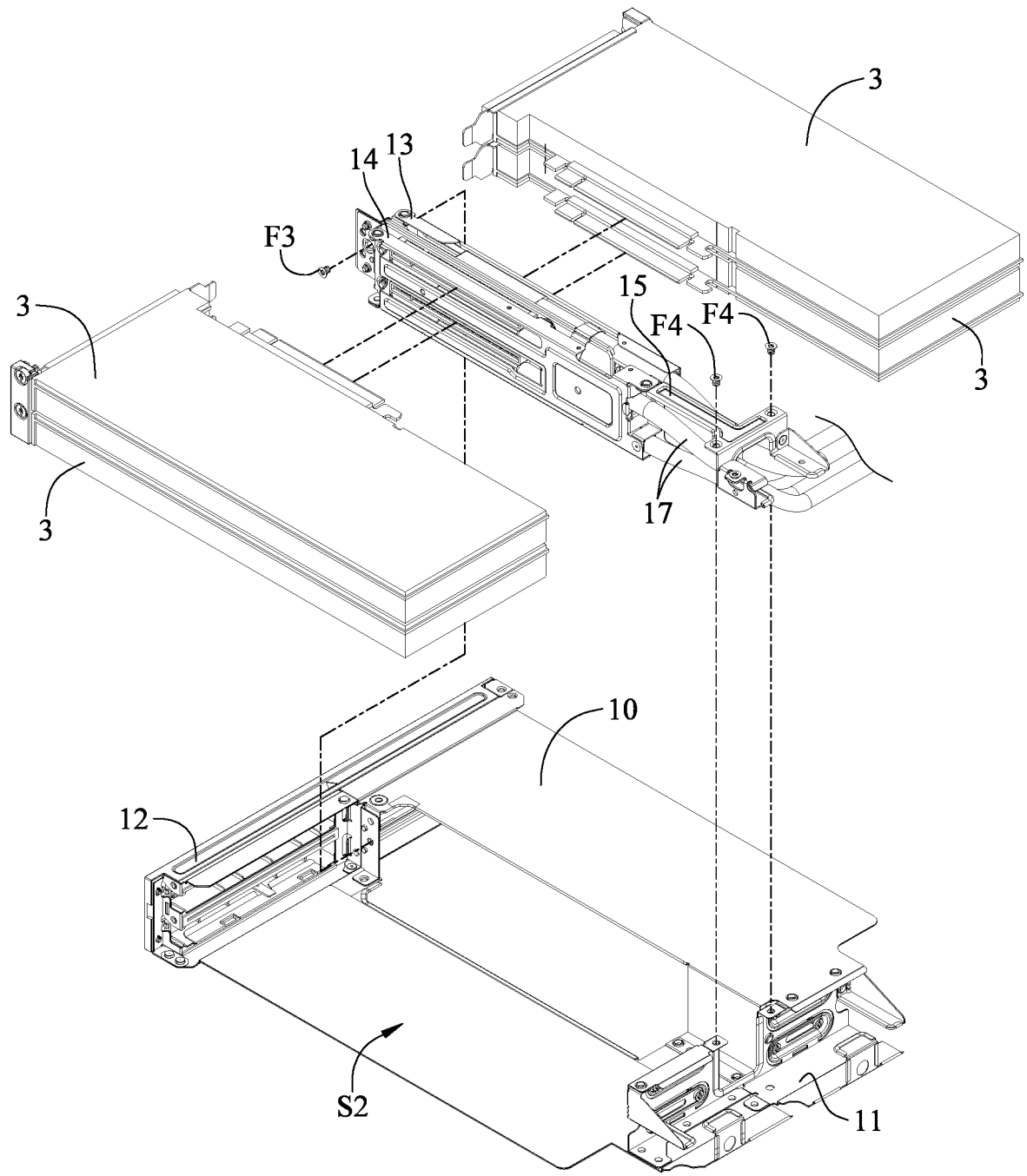
FIG. 5 is an exploded view of an expansion frame and an expansion card in FIG. 2.
Figure 6:
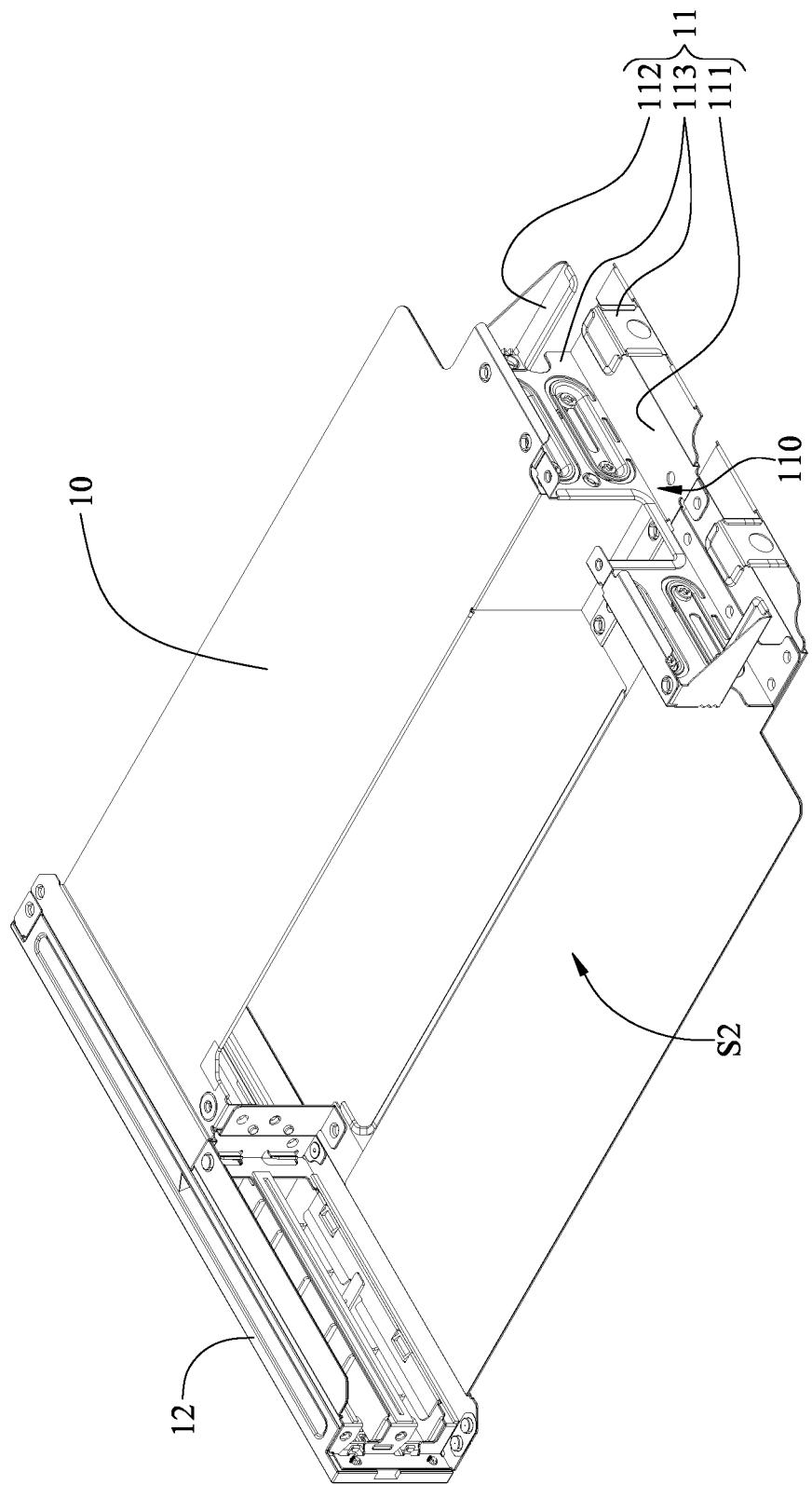
FIG. 6 is a perspective view of a main body and a cable gathering component in FIG. 2.
Figure 7:
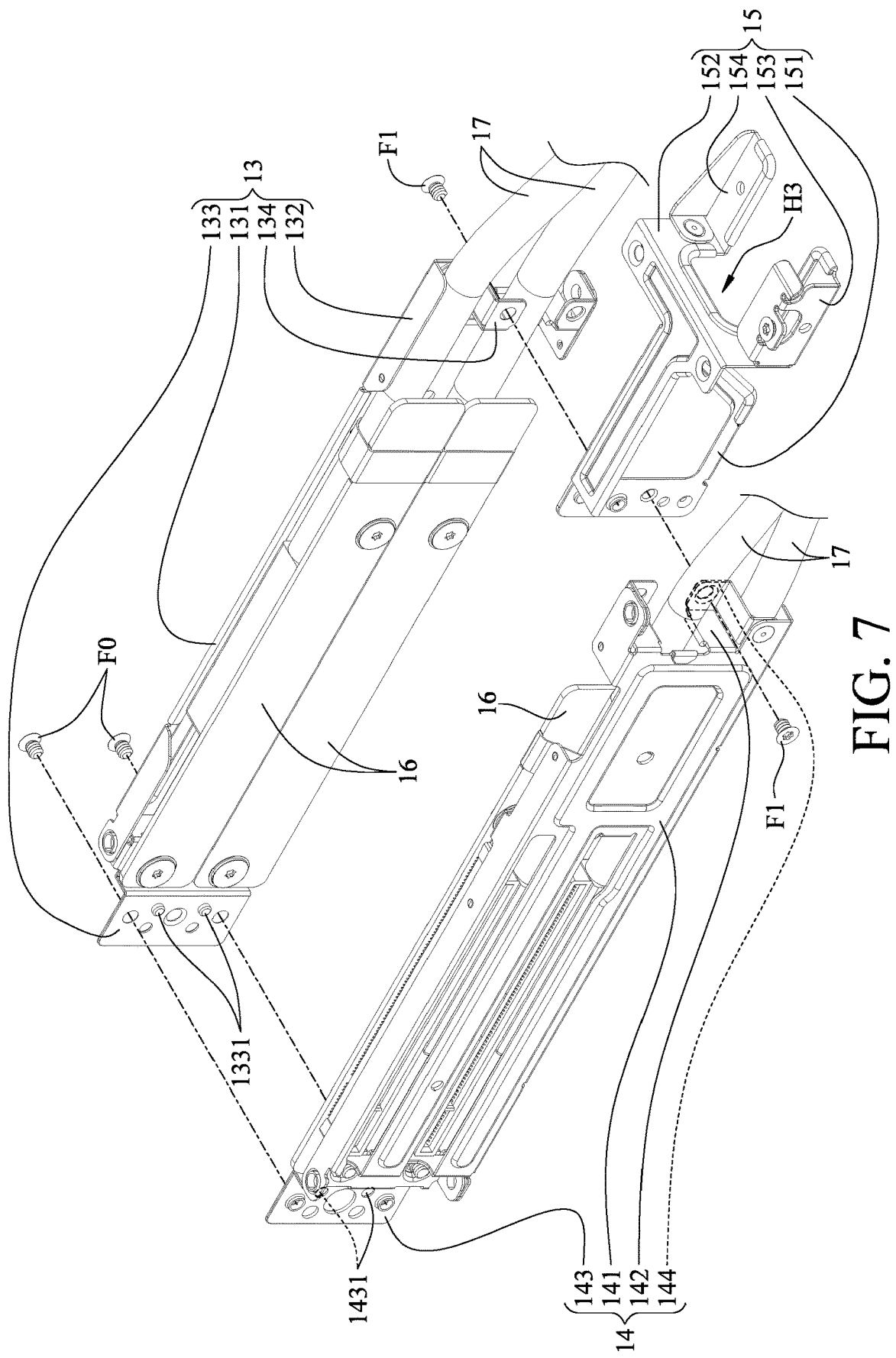
FIG. 7 is a partially exploded view of mount cages, a cable organizer, circuit boards and connection cables in FIG. 2.
Figure 8:
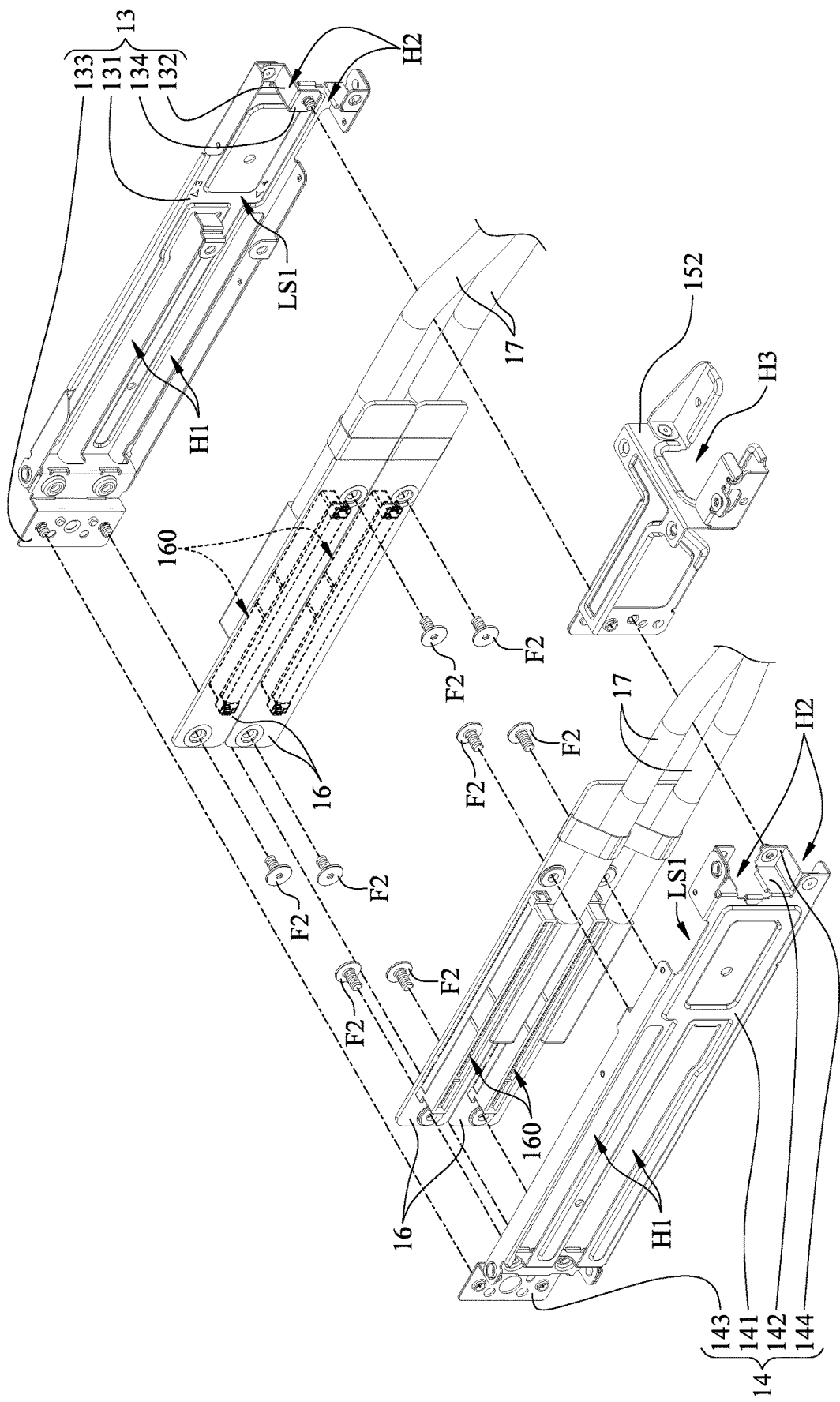
FIG. 8 is an exploded view of the mount cages, the cable organizer, the circuit boards and the connection cables in FIG. 2.

Please refer to FIG. 5 to FIG. 8. FIG. 5 is an exploded view of an expansion frame and an expansion card in FIG. 2, FIG. 6 is a perspective view of a main body and a cable gathering component in FIG. 2, FIG. 7 is a partially exploded view of mount cages, a cable organizer, circuit boards and connection cables in FIG. 2, and FIG. 8 is an exploded view of the mount cages, the cable organizer, the circuit boards and the connection cables in FIG. 2.

The mount cage 13 includes a bottom plate component 131, a lateral plate component 132 and a mount plate component 133. The lateral plate component 132 and the mount plate component 133 are connected to opposite sides of the bottom plate component 131, respectively. The mount cage 14 includes a bottom plate component 141, a lateral plate component 142 and a mount plate component 143. The lateral plate component 142 and the mount plate component 143 are connected to opposite sides of the bottom plate component 141, respectively. Each of the bottom plate components 131 and 141 has two through holes H1 and a wiring space LS1. Each of the lateral plate components 132 and 142 has two outlets H2. The mount plate components 133 and 143 of the two mount cages 13 and 14 are assembled with each other by fasteners F0, such as screws. Since the two mount cages 13 and 14 are substantially identical in size and similar in shape, the mount cages 13 and 14 may be provided with foolproof structures, thereby facilitating correct installation of the mount cages 13 and 14. In detail, the mount plate component 133 of the mount cage 13 may have two positioning protrusions 1331, the mount plate component 143 of the mount cage 14 may have two positioning holes 1431, and the positioning protrusions 1331 of the mount plate component 133 are disposed through the positioning holes 1431 of the mount plate component 143, respectively, such that it can be ensured that during the product manufacturing process, assemblers can correctly assemble the two corresponding mount cages 13 and 14 together; that is, the positioning protrusions 1331 of the mount plate component 133 and the positioning holes 1431 of the mount plate component 143 can provide foolproof effect to the assembling of the mount cages 13 and 14. However, the invention is not limited thereto. In other embodiments, the mount cages may not be provided with foolproof structures.

The cable organizer 15 includes a mount part 151, a cable organization part 152, a guiding plate part 153 and a pressing part 154. The mount part 151 is disposed between the mount cages 13 and 14. The cable organization part 152 is connected to the mount part 151 and extends in a direction from the mount part 151 towards the cable gathering component 11. The cable organization part 152 has a cable gathering hole H3 connected to the cable management space 110 of the cable gathering component 11. The guiding plate part 153 is connected to the cable organization part 152 and extends from the cable organization part 152 toward a direction away from the mount part 151, and the guiding plate part 153 is located on a side of the cable gathering hole H3 of the cable organization part 152. The pressing part 154 is connected to the cable organization part 152 and extends from the cable organization part 152 toward a direction away from the mount part 151 and into the cable management space 110, and the pressing part 154 is located on a side of the cable gathering hole H3 of the cable organization part 152.

Moreover, as shown in FIG. 7, the mount cage 13 further includes a fixing plate component 134 connected to the lateral plate component 132, and the mount cage 14 further includes a fixing plate component 144 connected to the lateral plate component 142. In addition, the fixing plate components 134 and 144 are fixed to the mount part 151 of the cable organizer 15 by fasteners F1, such as screws, respectively.

Two of the circuit boards 16 are disposed on the mount cage 13, and the other two of the circuit boards 16 are disposed on the mount cage 14. Each of the circuit boards 16 has an expansion slot (e.g., socket) 160. The expansion slots 160 of the circuit boards 16 disposed on the mount cage 13 and the expansion slots 160 of the circuit boards 16 disposed on the mount cage 14 face away from each other. Additionally, the expansion slots 160 of the circuit boards 16 correspond to the through holes H1 of the bottom plate components 131 and 141 of the mount cages 13 and 14, respectively, such that the expansion cards 3 can be disposed through the through holes H1 of the bottom plate components 131 and 141 and inserted into the expansion slots 160 of the circuit boards 16, respectively. In this embodiment, the circuit boards 16 may be fixed to the bottom plate components 131 and 141 of the mount cages 13 and 14 by fasteners F2 such as screws.

As shown in FIG. 5 to FIG. 8, the connection cables 17 are connected to the circuit boards 16, respectively, and the connection cables 17 extend from the wiring spaces LS1 of the bottom plate components 131 and 141 of the mount cages 13 and 14 through the outlets H2 of the lateral plate components 132 and 142, and are disposed through the cable gathering hole H3 of the cable organization part 152 of the cable organizer 15 and extend into the cable management space 110 of the cable gathering component 11. Furthermore, as shown in FIG. 3 and FIG. 6, the guiding plate part 153 of the cable organizer 15 may guide the connection cables 17 to bend in a predetermined direction and enter the cable management space 110 of the cable gathering component 11, and the pressing part 154 of the cable organizer 15 may press against the connection cables 17 located in the cable management space 110, such that the connection cables 17 is located between and clamped by the pressing part 154 and the bottom plate 111 of the cable gathering component 11, but the invention is not limited thereto. In other embodiments, the pressing part and the connection cables may be spaced apart from each other by a gap without contacting each other. Furthermore, the top plate 112 of the cable gathering component 11 may also press against the connection cables 17 located in the cable management space 110, such that the connection cables 17 is located between and clamped by the top plate 112 and the bottom plate 111, but the invention is not limited thereto. In other embodiments, the top plate of the cable gathering component and the connection cables may be spaced apart from each other by a gap without contacting each other. In this embodiment, opposite ends of the connection cables 17 are, for example, connected to the circuit boards 16 and a motherboard (not numbered) of the server 9, respectively.

The pressing part 154 may be optional, and the invention is not limited thereto. In other embodiments, the cable organizer may not be provided with a pressing part according to actual design requirements. Moreover, the guiding plate part 153 may be optional, and the invention is not limited thereto. In other embodiments, the cable organizer may not be provided with a guiding plate part according to actual design requirements.

In this embodiment, the mount plate components 133 and 143 of the mount cages 13 and 14 may be fixed to the main body 10 by fasteners F3, such as screws, and the cable organizer 15 may be fixed to the cable gathering component 11 by fasteners F4, such as screws.

The cover 12 may be optional, and the invention is not limited thereto. In other embodiments, the expansion frame may not be provided with a cover according to actual design requirements.

In this embodiment, the expansion slots 160 of the circuit boards 16 disposed on the mount cage 13 and the expansion slots 160 of the circuit boards 16 disposed on the mount cage 14 face away from each other, such that the expansion cards 3 can be easily inserted into the expansion slots 160, and four expansion cards 3 can be supported and installed in a limited space of a height of 1U. However, the invention is not limited to the directions of the expansion slots.

In view of the above description, since the expansion frame and the server can meet the requirement of supporting four expansion cards, there are many connection cables in the expansion frame. By the cable gathering component and the cable organizer of the expansion frame, the cable wiring in the expansion frame can be simplified, and the connection cables can be properly organized in a limited space, thereby providing a sufficient space for heat dissipation and ventilation and balancing the requirements for heat dissipation and easy cable management.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. An expansion frame, comprising:
a main body, having a storage space;
a cable gathering component, fixed to the main body, and the cable gathering component having a cable management space;
two mount cages, disposed in the storage space and located on a side of the cable gathering component, and the two mount cages being assembled with each other;
a cable organizer, comprising a mount part and a cable organization part connected to each other, the mount part disposed between the two mount cages, the cable organization part extending in a direction from the mount part towards the cable gathering component, and the cable organization part having a cable gathering hole connected to the cable management space of the cable gathering component;
four circuit boards, each having an expansion slot configured for an expansion card to be inserted into, two of the four circuit boards disposed on one of the two mount cages, and other two of the four circuit boards disposed on the other of the two mount cages; and
four connection cables, connected to the four circuit boards, respectively, and the four connection cables disposed through the cable gathering hole and extending into the cable management space of the cable gathering component.

2. The expansion frame according to claim 1, further comprising a cover disposed on a side of the main body opposite to the cable gathering component.

3. The expansion frame according to claim 1, wherein the cable gathering component comprises a bottom plate, a top plate and two lateral plates, the two lateral plates are opposite to each other and connected to the bottom plate, the two lateral plates are located between the bottom plate and the top plate, one of the two lateral plates is fixed to the main body, and the bottom plate, the top plate and the two lateral plates together surround and form the cable management space.

4. The expansion frame according to claim 1, wherein the expansion slots of two of the four circuit boards disposed on one of the two mount cages and the expansion slots of other two of the four circuit boards disposed on the other of the two mount cages face away from each other.

5. The expansion frame according to claim 1, wherein each of the two mount cages comprises a bottom plate component, a lateral plate component and a mount plate component, and the lateral plate component and the mount plate component are connected to opposite sides of the bottom plate component, respectively;
wherein each of the bottom plate components has a through hole and a wiring space, each of the lateral plate components has an outlet, the expansion slots of the four circuit boards correspond to the through holes, the four connection cables extend from the wiring spaces through the outlets, and the mount plate components of the two mount cages are assembled and fixed to each other.

6. The expansion frame according to claim 5, wherein one of the mount plate components of the two mount cages has at least one positioning protrusion, the other of the mount plate components of the two mount cages has at least one positioning hole, and the at least one positioning protrusion is disposed through the at least one positioning hole.

7. The expansion frame according to claim 5, wherein each of the two mount cages further comprises a fixing plate component, the fixing plate components are connected to the lateral plate components, respectively, and the fixing plate components are fixed to the mount part of the cable organizer.

8. The expansion frame according to claim 1, wherein the cable organizer further comprises a guiding plate part, the guiding plate part is connected to the cable organization part and extends from the cable organization part toward a direction away from the mount part, and the guiding plate part is located on a side of the cable gathering hole of the cable organization part.

9. The expansion frame according to claim 1, wherein the cable organizer further comprises a pressing part, the pressing part is connected to the cable organization part and extends from the cable organization part toward a direction away from the mount part and into the cable management space, the pressing part is located on a side of the cable gathering hole of the cable organization part, and the pressing part presses against the four connection cables, such that the four connection cables is located between and clamped by the pressing part and the cable gathering component.

10. A server, comprising:
a server casing;
an expansion frame, disposed in an interior space of the server casing, and the expansion frame comprising:
a main body, having a storage space;
a cable gathering component, fixed to the main body, and the cable gathering component having a cable management space;
two mount cages, disposed in the storage space and located on a side of the cable gathering component, and the two mount cages being assembled with each other;
a cable organizer, comprising a mount part and a cable organization part connected to each other, the mount part disposed between the two mount cages, the cable organization part extending in a direction from the mount part towards the cable gathering component, and the cable organization part having a cable gathering hole connected to the cable management space of the cable gathering component;
four circuit boards, each having an expansion slot, two of the four circuit boards disposed on one of the two mount cages, and other two of the four circuit boards disposed on the other of the two mount cages; and
four connection cables, connected to the four circuit boards, respectively, and the four connection cables disposed through the cable gathering hole and extending into the cable management space of the cable gathering component; and
at least one expansion card inserted into the expansion slot of one of the four circuit boards.

\* \* \* \* \*